United States Patent
Li et al.

(10) Patent No.: US 8,930,792 B2
(45) Date of Patent: Jan. 6, 2015

(54) SYSTEMS AND METHODS FOR DISTRIBUTED LOW DENSITY PARITY CHECK DECODING

(71) Applicant: LSI Corporation, Milpitas, CA (US)

(72) Inventors: Shu Li, San Jose, CA (US); Shaohua Yang, San Jose, CA (US); Zongwang Li, Santa Clara, CA (US); Yang Han, Sunnyvale, CA (US)

(73) Assignee: LSI Corporation, San Jose, CA (US)

( * ) Notice: Subject to any disclaimer, the term of this patent is extended or adjusted under 35 U.S.C. 154(b) by 101 days.

(21) Appl. No.: 13/766,891

(22) Filed: Feb. 14, 2013

(65) Prior Publication Data
US 2014/0229806 A1    Aug. 14, 2014

(51) Int. Cl.
| | | |
|---|---|---|
| H03M 13/00 | (2006.01) |
| H03M 13/13 | (2006.01) |
| H03M 13/29 | (2006.01) |
| G11B 20/18 | (2006.01) |
| H04L 1/00 | (2006.01) |

(52) U.S. Cl.
CPC .......... *H03M 13/13* (2013.01); *H03M 13/2975* (2013.01); *H04L 1/0052* (2013.01); *H04L 1/005* (2013.01); *H04L 1/0066* (2013.01); *H03M 13/2978* (2013.01); *H03M 13/6561* (2013.01); *G11B 20/1833* (2013.01); *G11B 2020/185* (2013.01)
USPC ........... 714/757; 714/776; 714/780; 714/807; 714/808; 714/758

(58) Field of Classification Search
CPC ..................... H03M 13/2975; H03M 13/2978; H03M 13/6561; H04L 1/005; H04L 1/0052; H04L 1/0066
See application file for complete search history.

(56) References Cited

U.S. PATENT DOCUMENTS

| | | |
|---|---|---|
| 4,553,221 A | 11/1985 | Hyatt |
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |

(Continued)

FOREIGN PATENT DOCUMENTS

| | | |
|---|---|---|
| JP | 2001/319433 A | 11/2001 |
| WO | WO 2010/059264 A1 | 5/2010 |
| WO | WO 2010/126482 A1 | 11/2010 |

OTHER PUBLICATIONS

U.S. Appl. No. 13/426,714, filed Mar. 22, 2012, Shaohua Yang.

(Continued)

*Primary Examiner* — John P Trimmings
(74) *Attorney, Agent, or Firm* — Hamilton DeSanctis & Cha

(57) ABSTRACT

Systems and method relating generally to data processing, and more particularly to systems and methods for utilizing multiple data streams for data recovery from a storage device. In some cases the systems include a low density parity check data decoder circuit including at least a first data decoder engine and a second data decoder engine each electrically coupled to a common circuit. The common circuit is operable to: shift a combination of both a first sub-message from the first data decoder engine and the second sub-message from the second data decoder engine to yield an shifted output, and disaggregate the shifted output to yield a third sub-message to the first data decoder engine and a fourth sub-message to the second decoder engine.

22 Claims, 5 Drawing Sheets

(56) References Cited

U.S. PATENT DOCUMENTS

| | | | |
|---|---|---|---|
| 5,392,299 A | 2/1995 | Rhines | |
| 5,417,500 A | 5/1995 | Martinie | |
| 5,450,253 A | 9/1995 | Seki | |
| 5,513,192 A | 4/1996 | Janku | |
| 5,523,903 A | 6/1996 | Hetzler | |
| 5,550,810 A | 8/1996 | Monogioudis et al. | |
| 5,550,870 A | 8/1996 | Blaker | |
| 5,612,964 A | 3/1997 | Haraszti | |
| 5,710,784 A | 1/1998 | Kindred | |
| 5,717,706 A | 2/1998 | Ikeda | |
| 5,802,118 A | 9/1998 | Bliss | |
| 5,844,945 A | 12/1998 | Nam | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | Mccalissister | |
| 6,023,783 A | 2/2000 | Divsalar | |
| 6,029,264 A | 2/2000 | Kobayashi | |
| 6,065,149 A | 5/2000 | Yamanaka | |
| 6,097,764 A | 8/2000 | McCallister | |
| 6,145,110 A | 11/2000 | Khayrallah | |
| 6,216,249 B1 | 4/2001 | Bliss | |
| 6,216,251 B1 | 4/2001 | McGinn | |
| 6,266,795 B1 | 7/2001 | Wei | |
| 6,317,472 B1 | 11/2001 | Choi | |
| 6,351,832 B1 | 2/2002 | Wei | |
| 6,377,610 B1 | 4/2002 | Hagenauer | |
| 6,381,726 B1 | 4/2002 | Weng | |
| 6,412,088 B1 | 6/2002 | Patapoutian et al. | |
| 6,473,878 B1 | 10/2002 | Wei | |
| 6,535,553 B1 | 3/2003 | Limberg et al. | |
| 6,625,775 B1 | 9/2003 | Kim | |
| 6,748,034 B2 | 6/2004 | Hattori | |
| 6,757,862 B1 | 6/2004 | Marianetti, II | |
| 6,785,863 B2 | 8/2004 | Blankenship | |
| 6,810,502 B2 | 10/2004 | Eidson | |
| 6,970,511 B1 | 11/2005 | Barnette | |
| 6,975,692 B2 | 12/2005 | Razzell | |
| 6,986,098 B2 | 1/2006 | Poeppelman | |
| 7,035,327 B2 | 4/2006 | Nakajima et al. | |
| 7,047,474 B2 | 5/2006 | Rhee | |
| 7,058,873 B2 | 6/2006 | Song et al. | |
| 7,073,118 B2 | 7/2006 | Greenberg | |
| 7,093,179 B2 | 8/2006 | Shea | |
| 7,117,427 B2 | 10/2006 | Ophir | |
| 7,133,228 B2 | 11/2006 | Fung | |
| 7,136,244 B1 | 11/2006 | Rothberg | |
| 7,184,486 B1 | 2/2007 | Wu | |
| 7,191,378 B2 | 3/2007 | Eroz | |
| 7,203,887 B2 | 4/2007 | Eroz | |
| 7,237,181 B2 | 6/2007 | Richardson | |
| 7,308,061 B1 | 12/2007 | Huang | |
| 7,310,768 B2 | 12/2007 | Eidson | |
| 7,313,750 B1 | 12/2007 | Feng | |
| 7,370,258 B2 | 5/2008 | Iancu | |
| 7,415,651 B2 | 8/2008 | Argon | |
| 7,502,189 B2 | 3/2009 | Sawaguchi | |
| 7,523,375 B2 | 4/2009 | Spencer | |
| 7,587,657 B2 | 9/2009 | Haratsch | |
| 7,590,168 B2 | 9/2009 | Raghavan | |
| 7,596,196 B1 | 9/2009 | Liu et al. | |
| 7,646,829 B2 | 1/2010 | Ashley | |
| 7,702,986 B2 | 4/2010 | Bjerke | |
| 7,752,523 B1 | 7/2010 | Chaichanavong | |
| 7,779,325 B2 | 8/2010 | Song | |
| 7,802,172 B2 | 9/2010 | Casado | |
| 7,952,824 B2 | 5/2011 | Dziak | |
| 7,958,425 B2 | 6/2011 | Chugg | |
| 7,962,828 B2* | 6/2011 | Kyung et al. | 714/758 |
| 7,996,746 B2 | 8/2011 | Livshitz | |
| 8,018,360 B2 | 9/2011 | Nayak | |
| 8,020,078 B2 | 9/2011 | Richardson | |
| 8,161,361 B1 | 4/2012 | Song et al. | |
| 8,201,051 B2 | 6/2012 | Tan | |
| 8,225,168 B2 | 7/2012 | Yu et al. | |
| 8,237,597 B2 | 8/2012 | Liu | |
| 8,255,763 B1* | 8/2012 | Yang et al. | 714/755 |
| 8,261,171 B2 | 9/2012 | Annampedu | |
| 8,291,284 B2 | 10/2012 | Savin | |
| 8,291,299 B2 | 10/2012 | Ii | |
| 8,295,001 B2 | 10/2012 | Liu | |
| 8,443,267 B2* | 5/2013 | Zhong et al. | 714/780 |
| 8,607,118 B2* | 12/2013 | No et al. | 714/755 |
| 2002/0067780 A1 | 6/2002 | Razzell | |
| 2003/0123364 A1 | 7/2003 | Nakajima et al. | |
| 2003/0147168 A1 | 8/2003 | Galbraith et al. | |
| 2004/0194007 A1 | 9/2004 | Hocevar | |
| 2005/0243456 A1 | 11/2005 | Mitchell et al. | |
| 2006/0002689 A1 | 1/2006 | Yang et al. | |
| 2007/0297496 A1 | 12/2007 | Park et al. | |
| 2008/0037676 A1 | 2/2008 | Kyun et al. | |
| 2008/0069373 A1 | 3/2008 | Jiang | |
| 2008/0304558 A1 | 12/2008 | Zhu et al. | |
| 2009/0132893 A1* | 5/2009 | Miyazaki et al. | 714/776 |
| 2009/0177852 A1 | 7/2009 | Chen | |
| 2009/0185643 A1 | 7/2009 | Fitzpatrick | |
| 2010/0172046 A1 | 7/2010 | Liu et al. | |
| 2010/0322048 A1 | 12/2010 | Yang et al. | |
| 2011/0167227 A1 | 7/2011 | Yang | |
| 2011/0264987 A1 | 10/2011 | Li | |
| 2012/0124118 A1 | 5/2012 | Ivkovic | |
| 2012/0182643 A1 | 7/2012 | Zhang | |
| 2012/0207201 A1 | 8/2012 | Xia | |
| 2012/0212849 A1 | 8/2012 | Xu | |
| 2012/0262814 A1 | 10/2012 | Li | |
| 2012/0265488 A1 | 10/2012 | Sun | |
| 2013/0058431 A1* | 3/2013 | Fonseka et al. | 375/295 |

OTHER PUBLICATIONS

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

(56) References Cited

OTHER PUBLICATIONS

Moon et al, "Pattern-dependent noise prediction in signal-dependent Noise," IEEE JSAC, vol. 19, No. 4 pp. 730-743, Apr. 2001.
Moon et al., "Maximum transition run codes for data storage systems", IEEE Trans. Magn., vol. 32, No. 5, pp. 3992-3994 (Sep. 1996).
Patapoutian et al "Improving Re-Read Strategies by Waveform Averaging" IEEE Transactions on Mag. vol. 37 No. 6, Nov. 2001.
Richardson, T "Error Floors of LDPC Codes" Flarion Technologies Bedminster NJ 07921, tjr@flarion.com (not dated).
Shokrollahi "LDPC Codes: An Introduction", Digital Fountain, Inc. (Apr. 2, 2003).
Spagnol et al, "Hardware Implementation of GF(2m) LDPC Decoders", IEEE Transactions on Circuits and Systemsŝi: Regular Papers, vol. 56, No. 12 (Dec. 2009).
Tehrani et al., "Fully Parallel Stochastic LDPC Decoders", IEEE Transactions on Signal Processing, vol. 56, No. 11 (Nov. 2008).
Todd et al., "Enforcing maximum-transition-run code constraints and low-density parity check decoding", IEEE Trans. Magn., vol. 40, No. 6, pp. 3566-3571 (Nov. 2004).
U.S. Appl. No. 13/296,022, Unpublished (filed Nov. 14, 2011) (Victor Krachkovsky).
U.S. Appl. No. 13/239,683, Unpublished (filed Sep. 22, 2011) (Changyou Xu).
U.S. Appl. No. 13/186,234, Unpublished (filed Jul. 19, 2011) (Haitao Xia).
U.S. Appl. No. 13/746,301, Unpublished (filed Jan. 21, 2013) (Shu Li).
U.S. Appl. No. 13/283,549, Unpublished (filed Oct. 27, 2011) (Wu Chang).
U.S. Appl. No. 13/300,078, Unpublished (filed Nov. 18, 2011) (Chung-Li Wang).
U.S. Appl. No. 13/302,119, Unpublished (filed Nov. 22, 2011) (Lei Chen).
U.S. Appl. No. 13/305,510, Unpublished (filed Nov. 28, 2011) (Lei Chen).
U.S. Appl. No. 13/305,551, Unpublished (filed Nov. 28, 2011) (Yang Han).
U.S. Appl. No. 13/174,537, Unpublished (filed Jun. 30, 2011) (Anantha Raman Krishnan).
U.S. Appl. No. 13/174,453, Unpublished (filed Jun. 30, 2011) (Johnson Yen).
U.S. Appl. No. 13/171,615, Unpublished (filed Jun. 29, 2011) (Bradley D. Seago).
U.S. Appl. No. 13/113,219, Unpublished (filed May 23, 2011) (Yang Han).
U.S. Appl. No. 13/227,544, Unpublished (filed Sep. 8, 2011) (Shaohua Yang).
U.S. Appl. No. 13/213,751, Unpublished (filed Aug. 19, 2011) (Fan Zhang).
U.S. Appl. No. 13/227,416, Unpublished (filed Sep. 7, 2011) (Lei Chen).
U.S. Appl. No. 13/415,430, Unpublished (filed Mar. 8, 2012) (Nayak Ratnakar Aravind).
U.S. Appl. No. 13/545,833, Unpublished (filed Jul. 10, 2012) (Zhi Bin Li).
U.S. Appl. No. 13/269,832, Unpublished (filed Oct. 10, 2011) (Haitao Xia).
U.S. Appl. No. 13/596,947, Unpublished (filed Aug. 28, 2012) (Fan Zhang).
U.S. Appl. No. 13/180,495, Unpublished (filed Jul. 11, 2011) (Chung-Li Wang).
U.S. Appl. No. 13/596,978, Unpublished (filed Aug. 28, 2012) (Fan Zhang).
U.S. Appl. No. 13/597,001, Unpublished (filed Aug. 28, 2012) (Fan Zhang).
U.S. Appl. No. 13/433,693, Unpublished (filed Mar. 29, 2012) (Fan Zhang).
U.S. Appl. No. 13/621,341, Unpublished (filed Sep. 17, 2012) (Shaohua Yang).
U.S. Appl. No. 13/596,819, Unpublished (filed Aug. 28, 2012) (Shaohua Yang).
U.S. Appl. No. 13/415,326, Unpublished (filed Mar. 8, 2012) (Shaohua Yang).
U.S. Appl. No. 13/989,583, Unpublished (filed Oct. 15, 2012) (Shaohua Yang).
U.S. Appl. No. 13/483,100, Unpublished (filed May 30, 2012) (Fan Zhang).
U.S. Appl. No. 13/483,105, Unpublished (filed May 30, 2012) (Xuebin Wu).
U.S. Appl. No. 13/426,693, Unpublished (filed Mar. 22, 2012) (Shaohua Yang).
U.S. Appl. No. 13/705,407, Unpublished (filed Dec. 5, 2012) (Lingyan Sun).
U.S. Appl. No. 13/652,012, Unpublished (filed Oct. 15, 2012) (Fan Zhang).
U.S. Appl. No. 13/619,907, Unpublished (filed Sep. 14, 2012) (Fan Zhang).
U.S. Appl. No. 13/284,730, Unpublished (filed Oct. 28, 2011) (Fan Zhang).
U.S. Appl. No. 13/316,741, Unpublished (filed Dec. 12, 2011) (Yang Han).
U.S. Appl. No. 13/327,279, Unpublished (filed Dec. 15, 2011) (Wei Feng).
U.S. Appl. No. 13/340,974, Unpublished (filed Dec. 30, 2011) (Dan Liu).
U.S. Appl. No. 13/474,660, Unpublished (filed May 17, 2012) (Zongwang Li).
U.S. Appl. No. 13/445,848, Unpublished (filed Apr. 12, 2012) (Bruce Wilson).
U.S. Appl. No. 13/340,951, Unpublished (filed Dec. 30, 2011) (Lei Chen).
U.S. Appl. No. 13/445,878, Unpublished (filed Apr. 12, 2012) (Yu Liao).
U.S. Appl. No. 13/269,852, Unpublished (filed Oct. 10, 2011) (Haitao Xia).
U.S. Appl. No. 13/316,858, Unpublished (filed Dec. 12, 2011) (Zongwang Li).
U.S. Appl. No. 13/295,150, Unpublished (filed Nov. 14, 2011) (Zongwang Li).
U.S. Appl. No. 13/362,409, Unpublished (filed Jan. 31, 2012) (Fan Zhang).
U.S. Appl. No. 13/412,520, Unpublished (filed Mar. 5, 2012) (Fan Zhang).
U.S. Appl. No. 13/426,714, Unpublished (filed Mar. 22, 2012) (Shaohua Yang).
U.S. Appl. No. 13/372,580, Unpublished (filed Feb. 14, 2012) (Fan Zhang).
U.S. Appl. No. 13/422,986, Unpublished (filed Mar. 16, 2012) (Fan Zhang).
U.S. Appl. No. 13/284,767, Unpublished (filed Oct. 28, 2011) (Fan Zhang).
U.S. Appl. No. 13/369,468, Unpublished (filed Feb. 9, 2012) (Zongwang Li).
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xiao, et al "Nested Codes With Multiple Interpretations" retrieved from the Internet URL: http://www.ece.nmsu.edu/~jkliewer/paper/XFKC_CISS06 (retrieved on Dec. 5, 2012).
Yeo et al., "VLSI Architecture for Iterative Decoders in Magnetic Storage Channels", Mar. 2001, pp. 748-755, IEEE trans. Magnetics, vol. 37, No. 2.

(56) References Cited

OTHER PUBLICATIONS

Zhang et al., "Analysis of Verification-Based Decoding on the q-ary Symmetric Channel for Large q", IEEE Trans. On Information Theory, vol. 57, No. 10 (Oct. 2011).

Zhong et al., "Quasi Cyclic LDPC Codes for the Magnetic Recording Channel: Code Design and VSLI Implementation", IEEE Transactions on Magnetics, v. 43, pp. 1118-1123, Mar. 7, 2007.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Joint Code-Encoder Design for LDPC Coding System VLSI Implementation", ISCAS, IEEE pp. 389-392, May 2004.

Zhong, "Block-LDPC: A Practical LDPC Coding System Design Approach", IEEE Trans. On Circuits, Regular Papers, vol. 5, No. 4, pp. 766-775, Apr. 2005.

\* cited by examiner

SYSTEMS AND METHODS FOR DISTRIBUTED LOW DENSITY PARITY CHECK DECODING

FIELD OF THE INVENTION

The present inventions are related to systems and methods for data processing, and more particularly to systems and methods for performing data decoding.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The data decoding can become relatively complex making implementation in a high speed system costly and in some cases not possible.

Hence, for at least the aforementioned reasons, there exists a need in the art for advanced systems and methods for data decoding.

BRIEF SUMMARY

The present inventions are related to systems and methods for data processing, and more particularly to systems and methods for performing data decoding.

Various embodiments of the present invention provide data processing systems that include a low density parity check data decoder circuit. The low density parity check decoder circuit includes at least a first data decoder engine and a second data decoder engine each electrically coupled to a common circuit. The first data decoder engine is operable to perform variable node updating for a first portion of a codeword and the second data decoder engine is operable to perform variable node updating for a second portion of the codeword. The common circuit is operable to perform a syndrome calculation on a combination of at least the first portion and the second portion of the codeword.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
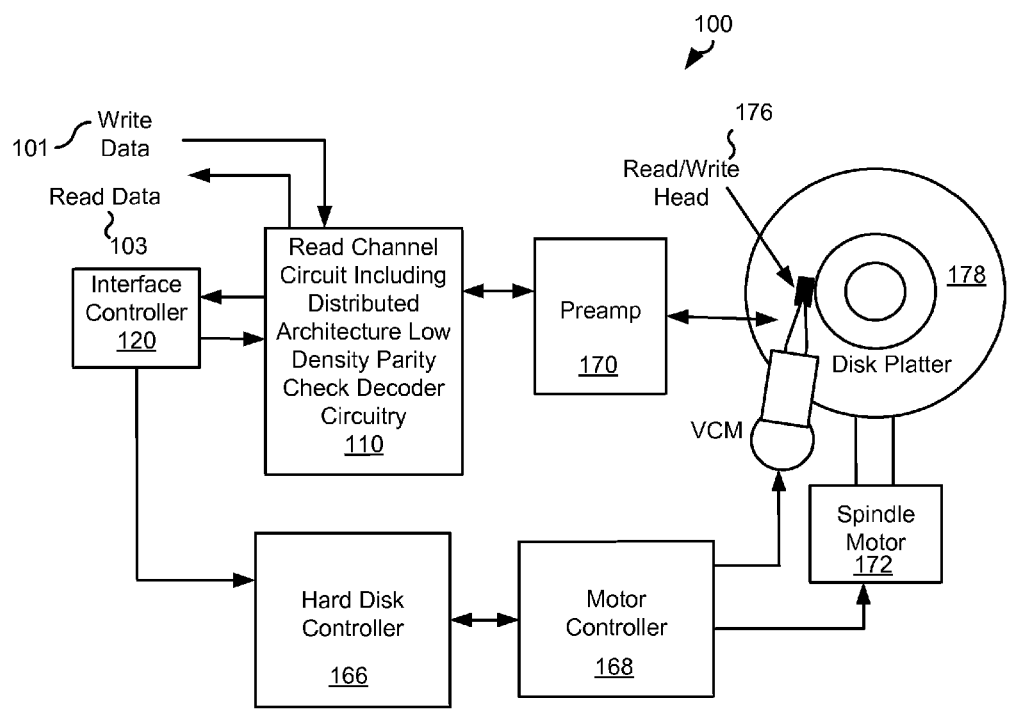
FIG. 1 shows a storage system including a distributed architecture low density parity check decoder circuitry in accordance with various embodiments of the present invention.

The present inventions are related to systems and methods for data processing, and more particularly to systems and methods for performing data decoding.

Various embodiments of the present invention provide data processing systems that include a low density parity check data decoder circuit. The low density parity check decoder circuit includes at least a first data decoder engine and a second data decoder engine each electrically coupled to a common circuit. The first data decoder engine is operable to perform variable node updating for a first portion of a codeword and the second data decoder engine is operable to perform variable node updating for a second portion of the codeword. The common circuit is operable to perform a syndrome calculation on a combination of at least the first portion and the second portion of the codeword. In some instances of the aforementioned embodiments, the first data decoder engine is not electrically connected to the second data decoder engine. In various instances of the aforementioned embodiments, the number of signal routes directly between the first data decoder engine and the second data decoder engine is less than twenty. In more particular instances, the number of signal routes directly between the first data decoder engine and the second data decoder engine is less than ten.

In various instances of the aforementioned embodiments, the first data decoder engine is operable to: generate a first new check node to variable node message; add a first portion of a codeword to the first new check node to variable node message to yield a first interim output; rearrange the first interim output to yield a first sub-message; and provide the first sub-message to the common circuit. The second data decoder engine is operable to: generate a second new check node to variable node message; add a second portion of the codeword to the second new check node to variable node message to yield a second interim output; rearrange the second interim output to yield a second sub-message; and provide the second sub-message to the common circuit. In some cases, the first data decoder engine includes: a first minimum path calculation circuit operable to calculate a first minimum path between a present node and a next node; and a first new message update circuit operable to generate the first new check node to variable node message based at least in part on the first minimum path. The second data decoder engine includes: a second minimum path calculation circuit operable to calculate a second minimum path between a present node and a next node; and a second new message update circuit operable to generate the second new check node to variable node message based at least in part on the second minimum path.

In one or more cases, the common circuit is operable to perform the syndrome calculation based at least in part on both the first sub-message and the second sub-message to yield a syndrome value. In some such cases, the common circuit is further operable to determine whether processing of a data set represented at least in part by the first sub-message and the second sub-message converged. In particular cases, processing of the data set is determined to converge when the syndrome value equals a defined value. The defined value may be zero. In various cases, the common circuit is further operable to: shift a combination of both the first sub-message and the second sub-message to yield an shifted output; and disaggregate the shifted output to yield a third sub-message to the first data decoder engine and a fourth sub-message to the second decoder engine. In some such cases, the first data decoder engine is further operable to: generate a first old check node to variable node message; subtract the third sub-message from the first old check node to variable node message to yield a third interim output; and normalize the third interim output to an expected range. The second data decoder engine is further operable to: generate a second old check node to variable node message; subtract the fourth sub-message from the second old check node to variable node message to yield a fourth interim output; and normalize the fourth interim output to the expected range.

In some instances of the aforementioned embodiments, the first data decoder circuit and the second data decoder circuit are physically layed out in relation to the common circuit such that at least one side of the common circuit is physically accessible by routes from another circuit. In various instances of the aforementioned embodiments, the data processing system is implemented as an integrated circuit. In some instances of the aforementioned embodiments, the data processing system is incorporated in, for example, a storage device or a data communication device.

Other embodiments of the present invention provide methods for data processing that include providing a distributed architecture data decoder circuit. The low density parity check data decoder circuit including at least a first data decoder engine and a second data decoder engine each electrically coupled to a common circuit. The first data decoder engine is operable to perform variable node updating for a first portion of a codeword and the second data decoder engine is operable to perform variable node updating for a second portion of the codeword, and the common circuit is operable to perform a syndrome calculation on a combination of at least the first portion and the second portion of the codeword. The methods further include: generating a first new check node to variable node message in the first data decoder engine, adding a first portion of a codeword to the first new check node to variable node message to yield a first interim output in the first data decoder engine, rearranging the first interim output to yield a first sub-message in the first data decoder engine, generating a second new check node to variable node message in the second data decoder engine, adding a second portion of the codeword to the second new check node to variable node message to yield a second interim output in the second data decoder engine, rearranging the second interim output to yield a second sub-message in the second data decoder engine, and providing the second sub-message to the common circuit.

In some instances of the aforementioned embodiments, the number of signal routes wires directly between the first data decoder engine and the second data decoder engine is less than twenty. In various instances of the aforementioned embodiments, the common circuit is operable to perform the syndrome calculation based at least in part on both the first sub-message and the second sub-message to yield a syndrome value. In one or more instances of the aforementioned embodiments, the methods further include: shifting a combination of both the first sub-message and the second sub-message to yield an shifted output in the common circuit; disaggregating the shifted output to yield a third sub-message to the first data decoder engine and a fourth sub-message to the second decoder engine in the common circuit; generating a first old check node to variable node message in the first data decoder engine; subtracting the third sub-message from the first old check node to variable node message to yield a third interim output in the first data decoder engine; normalizing the third interim output to an expected range in the first data decoder engine; generating a second old check node to variable node message in the second data decoder engine; subtracting the fourth sub-message from the second old check node to variable node message to yield a fourth interim output in the second data decoder engine; and normalizing the fourth interim output to the expected range in the second data decoder engine.

Turning to FIG. 1, a storage system 100 including a read channel circuit 110 having a distributed architecture low density parity check decoder circuitry in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

As part of processing the received information, read channel circuit 110 utilizes a distributed architecture low density parity check decoder circuit. In operation, a codeword is divided into multiple parallel portions that are fed to respective data decoder engines. The data decoder engines each include variable node update processors that generate check node to variable node messages and provide minimum path updating circuitry. One variable node processor in each of the respective data decoder engines provides an output to a circuit that is common to all of the data decoder engines. The other variable node update processor in each of the respective data decoder engines receives an input from the common circuit. The common circuit performs syndrome calculation, shifting and convergence checking for the information received from the data decoder engines, and provides both a decoder output in the case of convergence, and feedback to the data decoder engines where convergence fails. By distributing the architecture into multiple decoder engines that operate substantially autonomous from other decoder engines, routing and layout becomes more practical. Read channel circuit 110 may be implemented to include a data processing circuit similar to that set forth below in relation to FIGS. 3 and 4a-4b below.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platter 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
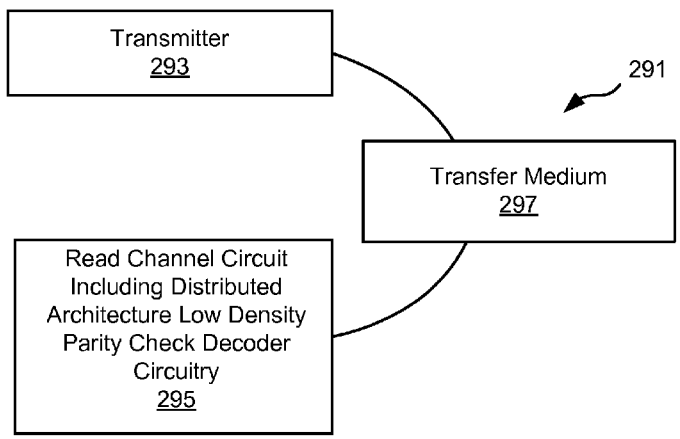
FIG. 2 depicts a data transmission system including a distributed architecture low density parity check decoder circuitry in accordance with one or more embodiments of the present invention.

Turning to FIG. 2, a data transmission system 291 including a receiver 295 having a distributed architecture low density parity check decoder circuitry in accordance with various embodiments of the present invention. Data transmission system 291 includes a transmitter 293 that is operable to transmit encoded information via a transfer medium 297 as is known in the art. The encoded data is received from transfer medium 297 by a receiver 295. Receiver 295 processes the received input to yield the originally transmitted data.

As part of processing the received information, receiver 295 utilizes a distributed architecture low density parity check decoder circuit. In operation, a codeword is divided into multiple parallel portions that are fed to respective data decoder engines. The data decoder engines each include variable node update processors that generate check node to variable node messages and provide minimum path updating circuitry. One variable node processor in each of the respective data decoder engines provides an output to a circuit that is common to all of the data decoder engines. The other variable node update processor in each of the respective data decoder engines receives an input from the common circuit. The common circuit performs syndrome calculation, shifting and convergence checking for the information received from the data decoder engines, and provides both a decoder output in the case of convergence, and feedback to the data decoder engines where convergence fails. By distributing the architecture into multiple decoder engines that operate substantially autonomous from other decoder engines, routing and layout becomes more practical. Receiver 295 may be implemented to include a data processing circuit similar to that set forth below in relation to FIGS. 3 and 4a-4b below.

Figure 3:
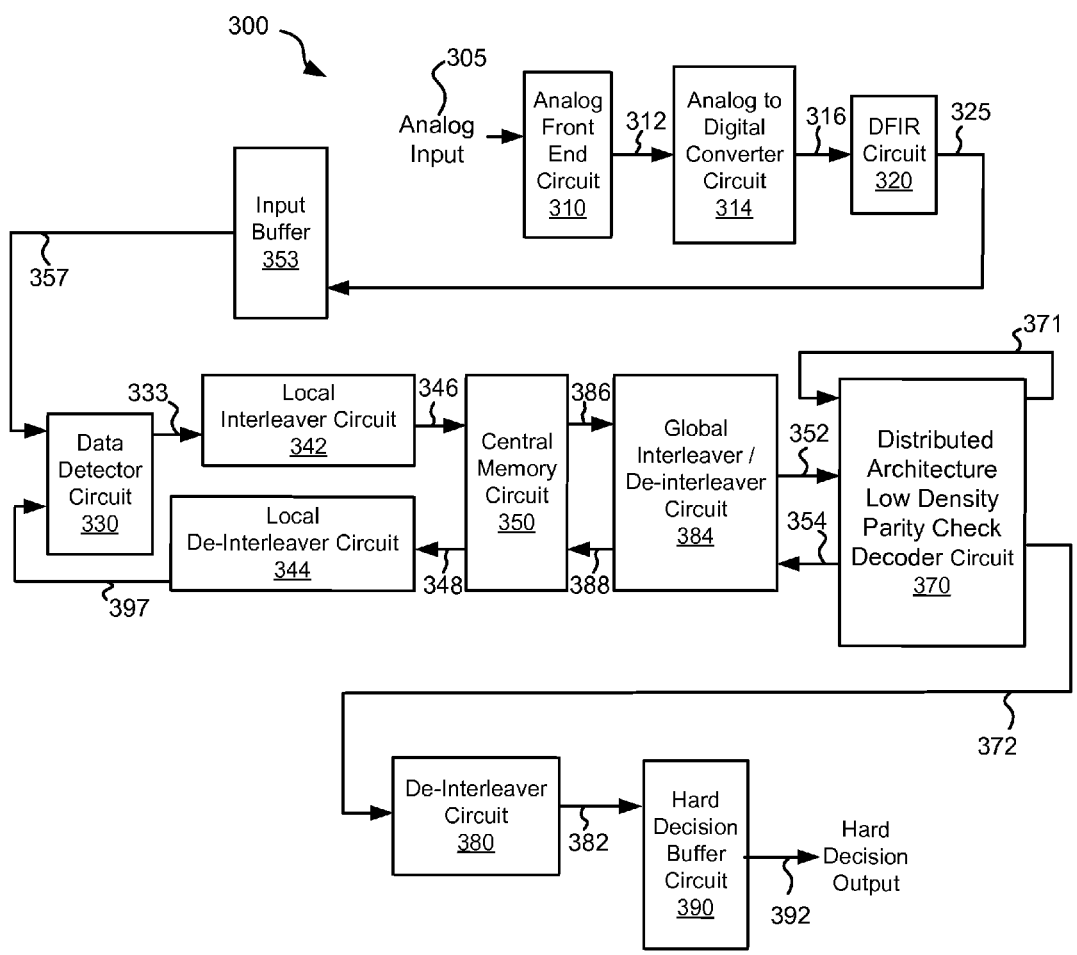
FIG. 3 shows a data processing circuit including a distributed architecture low density parity check decoder circuit in accordance with some embodiments of the present invention.

Turning to FIG. 3, a data processing circuit 300 including a distributed architecture low density parity check decoder circuit 370 in accordance with some embodiments of the present invention. Data processing circuit 300 includes an analog front end circuit 310 that receives an analog signal 305. Analog front end circuit 310 processes analog signal 305 and provides a processed analog signal 312 to an analog to digital converter circuit 314. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog signal 305 is derived from a read/write head assembly (not shown) that is disposed in relation to a storage medium (not shown). In other cases, analog signal 305 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 305 may be derived.

Analog to digital converter circuit 314 converts processed analog signal 312 into a corresponding series of digital samples 316. Analog to digital converter circuit 314 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 316 are provided to an equalizer circuit 320. Equalizer circuit 320 applies an equalization algorithm to digital samples 316 to yield an equalized output 325. In some embodiments of the present invention, equalizer circuit 320 is a digital finite impulse response filter circuit as are known in the art. It may be possible that equalized output 325 may be received directly from a storage device in, for example, a solid state storage system. In such cases, analog front end circuit 310, analog to digital converter circuit 314 and equalizer circuit 320 may be eliminated where the data is received as a digital data input. Equalized output 325 is stored to an input buffer 353 that includes sufficient memory to maintain a number of codewords until processing of that codeword is completed through a data detector circuit 330 and a layered decoder and non-layered reuse circuitry 370including, where warranted, multiple global iterations (passes through both data detector circuit 330 and a distributed architecture low density parity check decoder circuit 370) and/or local iterations (passes through a distributed architecture low density parity check decoder circuit 370 during a given global iteration). An output 357 is provided to data detector circuit 330.

Data detector circuit 330 may be a single data detector circuit or may be two or more data detector circuits operating in parallel on different codewords. Whether it is a single data detector circuit or a number of data detector circuits operating in parallel, data detector circuit 330 is operable to apply a data detection algorithm to a received codeword or data set. In some embodiments of the present invention, data detector circuit 330 is a Viterbi algorithm data detector circuit as are known in the art. In other embodiments of the present invention, data detector circuit 330 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 330 is used to apply the data detection algorithm to the received codeword for a first global iteration applied to the received codeword, and another data detector circuit included in data detector circuit 330 is operable apply the data detection algorithm to the received codeword guided by a decoded output accessed from a central memory circuit 350 on subsequent global iterations. As described below in relation to FIGS. 4a-4b, central memory circuit 350 divides the data sets into a defined number of portions that are processed by respective decoder engines implemented as part of distributed architecture low density parity check decoder circuit 370.

Upon completion of application of the data detection algorithm to the received codeword on the first global iteration, data detector circuit 330 provides a detector output 333. Detector output 333 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detector output 333 is provided to a local interleaver circuit 342. Local interleaver circuit 342 is operable to shuffle sub-portions (i.e., local chunks) of the data set included as detected output and provides an interleaved codeword 346 that is stored to central memory circuit 350. Interleaver circuit 342 may be any circuit known in the art that is capable of shuffling data sets to yield a re-arranged data set. Interleaved codeword 346 is stored to central memory circuit 350.

Once distributed architecture low density parity check decoder circuit 370 is available, portions of a previously stored interleaved codeword 346 are accessed from central memory circuit 350 as a stored codeword 386 and globally interleaved by a global interleaver/de-interleaver circuit 384. Global interleaver/de-interleaver circuit 384 may be any circuit known in the art that is capable of globally rearranging codewords. Global interleaver/De-interleaver circuit 384 provides a decoder input 352 as respective portions to respective data decoder engines implemented as part of distributed architecture low density parity check decoder circuit 370. One implementation of distributed architecture low density parity check decoder circuit 370 is set forth below in relation to FIGS. 4a-4b. Distributed architecture low density parity check decoder circuit 370 applies a low density parity check decode algorithm to the received data to yield a decoded output 371. As more fully discussed below, application of the low density parity check algorithm includes calculating check node to variable node messages for portions of the data set accessed from central memory 350 in respective data decoder engines that in turn produce an output. The produced output from each of the data decoder engines are provided to a circuit common to all of the data decoder engines. The common circuit performs syndrome calculation, shifting and convergence checking for the information received from the data decoder engines, and provides both a decoder output in the case of convergence, and feedback to the data decoder engines where convergence fails. By distributing the architecture into multiple data decoder engines that operate substantially autonomous from other data decoder engines, routing and layout of data decoder circuit 370 becomes more practical.

In cases where another local iteration (i.e., another pass through data decoder circuit 370) is desired, distributed architecture low density parity check decoder circuit 370 re-applies the data decode algorithm to decoder input 352 guided by decoded output 371. This continues until either a maximum number of local iterations is exceeded or decoded output 371 converges (i.e., completion of standard processing).

Where decoded output 371 fails to converge (i.e., fails to yield the originally written data set) and a number of local iterations through layered distributed architecture low density parity check decoder circuit 370 exceeds a threshold, the resulting decoded output is provided as a decoded output 354 back to central memory circuit 350 where it is stored awaiting another global iteration through a data detector circuit included in data detector circuit 330. Prior to storage of decoded output 354 to central memory circuit 350, decoded output 354 is globally de-interleaved to yield a globally de-interleaved output 388 that is stored to central memory circuit 350. The global de-interleaving reverses the global interleaving earlier applied to stored codeword 386 to yield decoder input 352. When a data detector circuit included in data detector circuit 330 becomes available, a previously stored de-interleaved output 388 is accessed from central memory circuit 350 and locally de-interleaved by a de-interleaver circuit 344. De-interleaver circuit 344 re-arranges decoder output 348 to reverse the shuffling originally performed by interleaver circuit 342. A resulting de-interleaved output 397 is provided to data detector circuit 330 where it is used to guide subsequent detection of a corresponding data set previously received as equalized output 325.

Alternatively, where the decoded output converges (i.e., yields the originally written data set), the resulting decoded output is provided as an output codeword 372 to a de-interleaver circuit 380 that rearranges the data to reverse both the global and local interleaving applied to the data to yield a de-interleaved output 382. De-interleaved output 382 is provided to a hard decision buffer circuit 390 that arranges the received codeword along with other previously received codewords in an order expected by a requesting host processor. The resulting output is provided as a hard decision output 392.

Figure 4A:
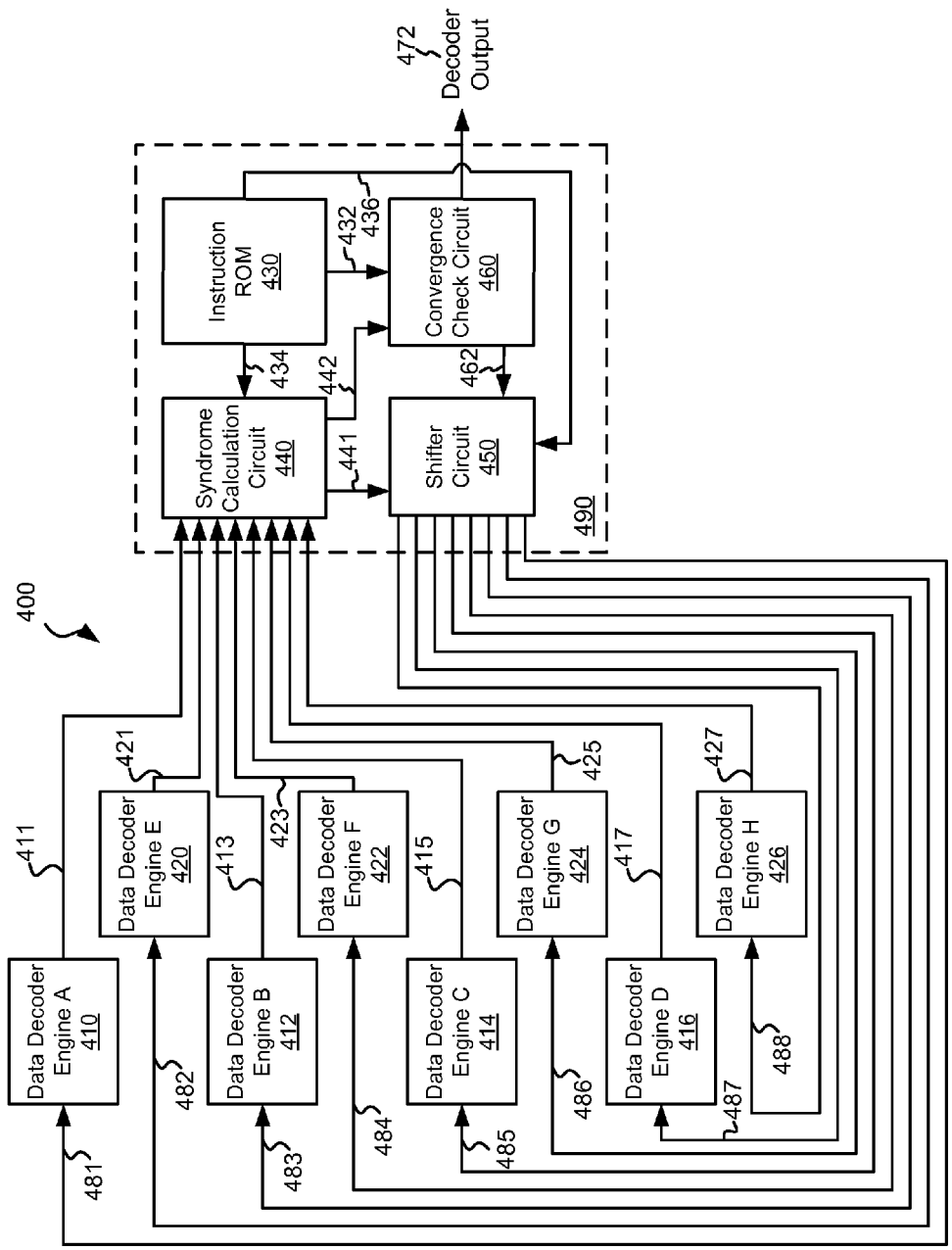
FIGS. 4a-4b depicts one implementation of a distributed architecture low density parity check decoder circuit in accordance with one or more embodiments of the present invention.

Turning to FIG. 4a, one implementation of a distributed architecture low density parity check decoder circuit 400 is shown in accordance with one or more embodiments of the present invention. Distributed architecture low density parity check decoder circuit 400 may be used in place of distributed architecture low density parity check decoder circuit 370 of FIG. 3. As shown, distributed architecture low density parity check decoder circuit 400 includes eight data decoder engines 410, 412, 414, 416, 418, 420, 422, 424, 426 and a common circuit 490. Of note, while distributed architecture low density parity check decoder circuit 400 is shown with eight data decoder engines, other embodiments of the present invention may be implemented by more or fewer data decoder engines.

Common circuit 490 includes a syndrome calculation circuit 440, a shifter circuit 450, a convergence check circuit 460, and an instruction read only memory (ROM) 432. Syndrome calculation circuit 440 is operable to calculate a syndrome of a processing codeword using sub-messages 411, 413, 415, 417, 421, 423, 425, 427 passed from each of the respective data decoder engines 410, 412, 414, 416, 418, 420, 422, 424, 426. Syndrome calculation circuit 440 may be implemented similar to any syndrome calculation circuit implemented as part of a low density parity check decoder circuit known in the art. Syndrome calculation circuit 440 operates based upon instructions 434 received from instruction ROM 430. A syndrome calculated by syndrome calculation circuit 440 is provided as a syndrome output 442 to convergence check circuit 460. In addition, syndrome calculation circuit 440 provides a aggregated message 441 (corresponding to decoded output 371 of FIG. 3) which is formed by aggregating the sub-messages 411, 413, 415, 417, 421, 423, 425, 427 from the respective data decoder engines 410, 412, 414, 416, 418, 420, 422, 424, 426 to a shifter circuit 450.

Convergence check circuit 460 uses syndrome output 442 to determine whether application of the data decode algorithm has resulted in the original data set. In one particular embodiment of the present invention, convergence check circuit 460 compares syndrome output 442 with an expected syndrome value. In particular embodiments of the present invention, convergence check circuit 460 operates based upon instructions 432 received from instruction ROM 430. Where syndrome output 442 matches the expected syndrome value, convergence check circuit 460 indicates a converged output 462 to shifter circuit 450, and provides the current state of distributed architecture low density parity check decoder circuit 400 as a decoder output 472 (corresponding to output codeword 372 of FIG. 3). Convergence check circuit 460 may be implemented similar to any convergence check circuit implemented as part of a low density parity check decoder circuit known in the art.

Shifter circuit 450 shifts aggregated message 441 to yield a shifted message set. The shifted message set is then disaggregated into sub-messages 481, 482, 483, 484, 485, 486, 487, 488. Sub-messages 481, 482, 483, 484, 485, 486, 487, 488 are provided back to the respective data decoder engines 410, 412, 414, 416, 418, 420, 422, 424, 426 where converged output 462 does not indicate a convergence, and thus another iteration is needed. In turn, the respective data decoder engines 410, 412, 414, 416, 418, 420, 422, 424, 426 process sub-messages 481, 482, 483, 484, 485, 486, 487, 488.

Figure 4B:
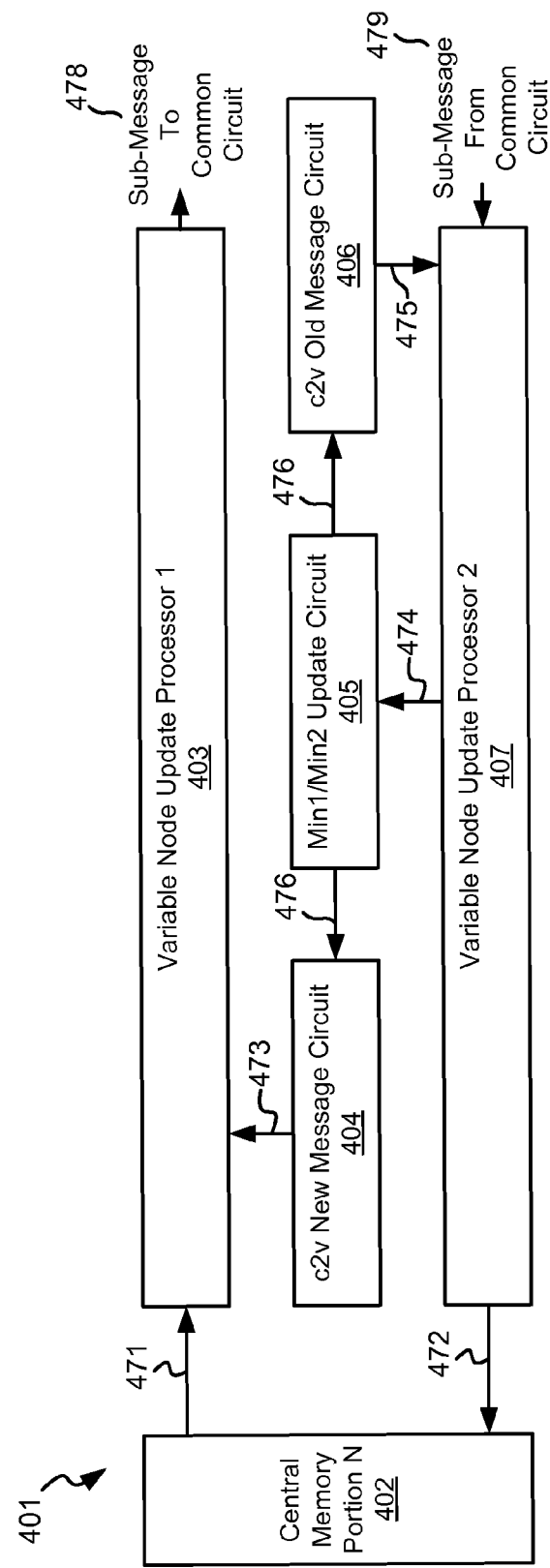

Turning to FIG. 4b, one implementation of a data decoder engine 401 is shown in accordance with one or more embodiments of the present invention. Data decoder engine 401 may be used in place of each of data decoder engines 410, 412, 414, 416, 418, 420, 422, 424, 426 of FIG. 4a. As shown, data decoder engine 401 includes a variable node update processor 403, a variable node update processor 407, a c2v new message circuit 404, a minimum path update circuit 405, and a c2v old message circuit 406. In addition, a central memory portion 402 is shown representing a portion of central memory 350 of FIG. 3 that is assigned to the particular data decoder engine.

In one particular embodiment of the present invention, the central memory portion associated with data decoder engine 410 maintains the first twelve (12) symbols (Symbols 0-11) of log likelihood ratio information; the central memory portion associated with data decoder engine 412 maintains the second twelve (12) symbols (Symbols 12-23) of log likelihood ratio information; the central memory portion associated with data decoder engine 414 maintains the third twelve (12) symbols (Symbols 24-35) of log likelihood ratio information; the central memory portion associated with data decoder engine 416 maintains the fourth twelve (12) symbols (Symbols 36-47) of log likelihood ratio information; the central memory portion associated with data decoder engine 420 maintains the fifth twelve (12) symbols (Symbols 48-59) of log likelihood ratio information; the central memory portion associated with data decoder engine 422 maintains the sixth twelve (12) symbols (Symbols 60-71) of log likelihood ratio information; the central memory portion associated with data decoder engine 424 maintains the seventh twelve (12) symbols (Symbols 72-83) of log likelihood ratio information; and the central memory portion associated with data decoder engine 426 maintains the eighth twelve (12) symbols (Symbols 84-95) of log likelihood ratio information.

Variable node update processor 403 is operable to add a portion 471 of a codeword from central memory portion 402 to a new check node to variable node message 473 to yield an interim output, and performs a delta rearrange of the interim output to yield a sub-message 478. Sub-message 478 is provided as a respective one of sub-messages 411, 413, 415, 417, 421, 423, 425, 427 described above in relation to FIG. 4a. The delta rearrange process may be any delta rearrange process implemented as part of a low density parity check encoder circuit.

Variable node update processor 407 subtracts a sub-message 479 from an old check node to variable node message 475 to yield an interim output, and normalizes the interim output to an expected range to yield a portion 472 of a codeword stored back to central memory portion 402. Sub-message 479 is one of the respective sub-messages 481, 482, 483, 484, 485, 486, 487, 488 described above in relation to FIG. 4b.

In addition, variable node update processor 407 provides portion 472 as a minimum path update output 474 to minimum path update circuit 405 that operates to determine a first minimum (referred to as mini representing the smallest distance between nodes on a trellis diagram), a second minimum (referred to as mini representing the next smallest distance between nodes on a trellis diagram), and an index. Minimum path update circuit 405 may be implemented similar to any minimum path update circuit implemented as part of a low density parity check decoder circuit known in the art. Minimum path update circuit 405 provides a determined minimum path output 476 (i.e., Min1/Min2/idx) to c2v new message circuit 404 and to c2v old message circuit 406.

Each of c2v new message circuit 404 and c2v old message circuit 406 update new check node to variable node message 473 and old check node to variable node message 475, respectively. c2v new message circuit 404 may be any circuit known in the art for generating a new check node to variable node message in a low density parity check decoder circuit. Similarly, c2v old message circuit 404 may be any circuit known in the art for generated an old check node to variable node message in a low density parity check decoder circuit.

Returning to FIG. 4a, the processing of check nodes in each of data decoder engines 410, 412, 414, 416, 418, 420, 422, 424, 426 is independent of processing of the check nodes in all of the other data decoder engines. As such, the need for electrical connection between respective ones of data decoder engines 410, 412, 414, 416, 418, 420, 422, 424, 426 is reduced which in turn reduces the routing congestion in a semiconductor device in which a data decoder circuit is implemented. In the case of data decoder engine 401, each of data decoder engines 410, 412, 414, 416, 418, 420, 422, 424, 426 processes one eighth (⅛th) of the check nodes for the overall codeword, and one eighth (⅛th) of the variable nodes of the overall codeword. In some embodiments of the present invention, the number of electrical connections from any of data decoder engines 410, 412, 414, 416, 418, 420, 422, 424, 426 to another one of the data decoder engines is less than twenty signal wires or routes. As used herein, the phrases "signal wire" or "signal route" are used interchangeably in their broadest sense to mean a connection between electrical components able to carry a signal between the electrical components. In some cases, the number of electrical connections from any of data decoder engines 410, 412, 414, 416, 418, 420, 422, 424, 426 to another one of the data decoder engines is less than ten signal wires or routes. In various cases, the number of electrical connections from any of data decoder engines 410, 412, 414, 416, 418, 420, 422, 424, 426 to another one of the data decoder engines is less than five signal wires or routes. In one particular case, there are not any physical routes or wires from any of data decoder engines 410, 412, 414, 416, 418, 420, 422, 424, 426 to another one of the data decoder engines.

Figure 5:
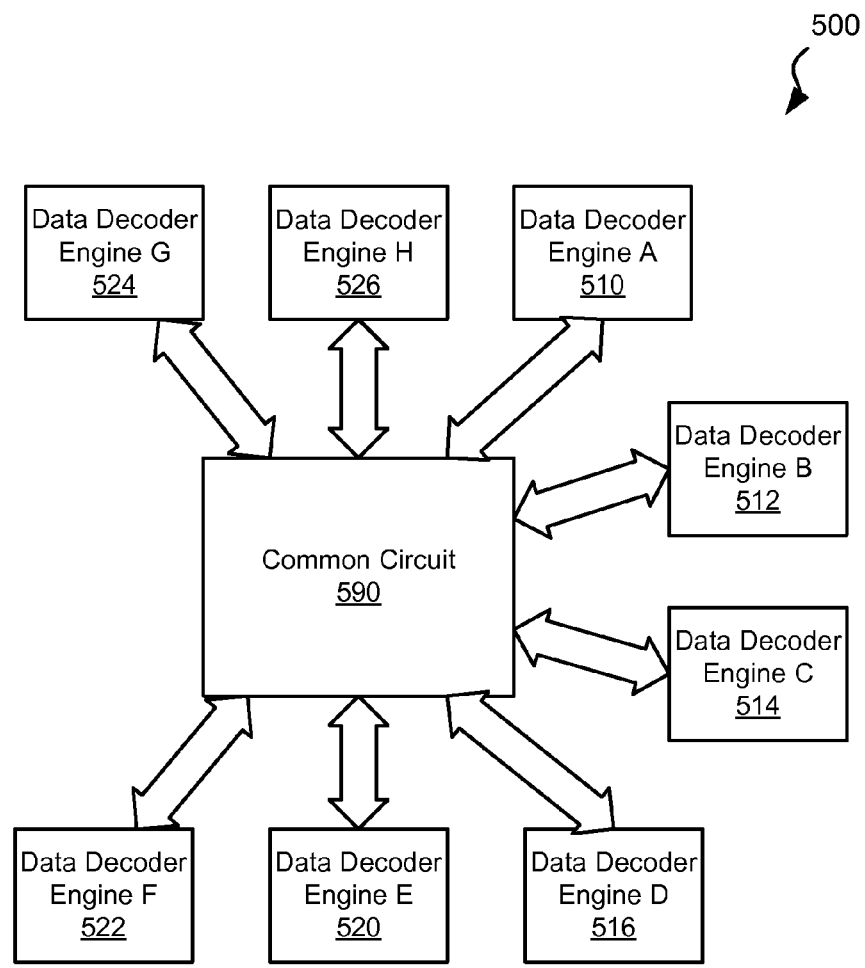
FIG. 5 shows an example physical layout facilitated by a distributed architecture low density parity check decoder circuit in accordance with some embodiments of the present invention.

Turning to FIG. 5 an example physical layout 500 facilitated by a distributed architecture low density parity check decoder circuit is shown in accordance with some embodiments of the present invention. As shown, the distributed architecture allows for physical distribution of data decoder engines 510, 512, 514, 516, 518, 520, 522, 524, 526 around the periphery of a common circuit 590. As physical connectivity between common circuit 590 and any given data decoder engine 510, 512, 514, 516, 518, 520, 522, 524, 526 is not extensive, layout and routing involved in implementing a data decoder circuit similar to that discussed above in relation to FIGS. 4a-4b is reduced when compared with prior art solutions using a non-distributed architecture. Of note, while FIG. 5 shows data decoder engines 510, 512, 514, 516, 518, 520, 522, 524, 526 to allow for routing connectivity with upstream processing circuitry in a data processing circuit (e.g., an upstream data detector circuit), other layouts are possible in accordance with other embodiments of the present invention. For example, data decoder engines 510, 512, 514, 516, 518, 520, 522, 524, 526 may be equally spaced around the periphery of a common circuit 590. Based upon the disclosure provided herein, one of ordinary skill in the art will recognize other physical layouts that are possible in accordance with different embodiments of the present invention.

In particular embodiments of the present invention, the memory portions included as part of each data decoder engine 510, 512, 514, 516, 518, 520, 522, 524, 526 are placed at the boundary of the overall data decoder circuit to reduce routing complexity caused by electrical connections coming from a data detector circuit side of a data processor.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:

a low density parity check data decoder circuit including at least a first data decoder engine and a second data decoder engine each electrically coupled to a common circuit, wherein the first data decoder engine is operable to perform variable node updating for a first portion of a codeword and to generate a first sub-message corresponding to the first portion, and the second data decoder engine is operable to perform variable node updating for a second portion of the codeword and to generate a second sub-message corresponding to the second portion, and wherein the common circuit is operable to: shift a combination of both the first sub-message and the second sub-message to yield a shifted output, and disaggregate the shifted output to yield a third sub-message to the first data decoder engine and a fourth sub-message to the second decoder engine.

2. The data processing system of claim 1, wherein the first data decoder engine is not electrically connected to the second data decoder engine.

3. The data processing system of claim 1, wherein the number of signal routes directly between the first data decoder engine and the second data decoder engine is less than twenty.

4. The data processing system of claim 1, wherein the number of signal routes directly between the first data decoder engine and the second data decoder engine is less than ten.

5. The data processing system of claim 1, wherein the common circuit is further operable to perform a syndrome calculation on a combination of at least the first portion and the second portion of the codeword.

6. The data processing system of claim 5, wherein:
the first data decoder engine is operable to:
generate a first new check node to variable node message;
add a first portion of a codeword to the first new check node to variable node message to yield a first interim output;
rearrange the first interim output to yield the first sub-message; and
provide the first sub-message to the common circuit;
the second data decoder engine is operable to:
generate a second new check node to variable node message;
add a second portion of the codeword to the second new check node to variable node message to yield a second interim output;
rearrange the second interim output to yield the second sub-message; and
provide the second sub-message to the common circuit.

7. The data processing system of claim 6, wherein:
the first data decoder engine includes:
a first minimum path calculation circuit operable to calculate a first minimum path between a present node and a next node; and
a first new message update circuit operable to generate the first new check node to variable node message based at least in part on the first minimum path; and
the second data decoder engine includes:
a second minimum path calculation circuit operable to calculate a second minimum path between a present node and a next node; and
a second new message update circuit operable to generate the second new check node to variable node message based at least in part on the second minimum path.

8. The data processing system of claim 6, wherein the common circuit is operable to:
perform the syndrome calculation based at least in part on both the first sub-message and the second sub-message to yield a syndrome value.

9. The data processing system of claim 8, wherein the common circuit is further operable to determine whether processing of a data set represented at least in part by the first sub-message and the second sub-message converged.

10. The data processing system of claim 9, wherein processing of the data set is determined to converge when the syndrome value equals a defined value.

11. The data processing system of claim 10, wherein the defined value is zero.

12. The data processing system of claim 8, wherein;
the first data decoder engine is further operable to:
generate a first old check node to variable node message;
subtract the third sub-message from the first old check node to variable node message to yield a third interim output; and
normalize the third interim output to an expected range; and
the second data decoder engine is further operable to:
generate a second old check node to variable node message;
subtract the fourth sub-message from the second old check node to variable node message to yield a fourth interim output; and
normalize the fourth interim output to the expected range.

13. The data processing system of claim 1, wherein the first data decoder engine and the second data decoder engine are physically layed out in relation to the common circuit such that at least one side of the common circuit is physically accessible by routes from another circuit.

14. The data processing system of claim 1, wherein the data processing system is implemented as an integrated circuit.

15. The data processing system of claim 1, wherein the data processing system is incorporated in a device selected from a group consisting of: a storage device, and a data communication device.

16. The data processing system of claim 1, wherein the data processing system is implemented as part of a data storage device, and wherein the data storage device comprises:
a storage medium operable to store information corresponding to a codeword;
a head assembly disposed in relation to the storage medium and operable to provide a sensed signal corresponding to the information;
a read channel circuit including:
an analog front end circuit operable to provide an analog signal corresponding to the sensed signal;
an analog to digital converter circuit operable to sample the analog signal to yield a series of digital samples; and
an equalizer circuit operable to equalize the digital samples corresponding to the data set to yield the codeword, wherein the codeword includes the first portion of the codeword and the second portion of the codeword.

17. A method for data processing, the method comprising:
providing a distributed architecture data decoder circuit, the distributed architecture data decoder circuit comprising:
a low density parity check data decoder circuit including at least a first data decoder engine and a second data decoder engine each electrically coupled to a common circuit, wherein the first data decoder engine is operable to perform variable node updating for a first portion of a codeword and the second data decoder engine is operable to perform variable node updating for a second portion of the same codeword, and wherein the common circuit is operable to perform a syndrome calculation on a combination of at least the first portion and the second portion of the codeword;
generating a first new check node to variable node message in the first data decoder engine;
adding a first portion of a codeword to the first new check node to variable node message to yield a first interim output in the first data decoder engine;

rearranging the first interim output to yield a first sub-message in the first data decoder engine;

generating a second new check node to variable node message in the second data decoder engine;

adding a second portion of the codeword to the second new check node to variable node message to yield a second interim output in the second data decoder engine;

rearranging the second interim output to yield a second sub-message in the second data decoder engine; and providing the second sub-message to the common circuit;

shifting a combination of both the first sub-message and the second sub-message to yield a shifted output in the common circuit; and disaggregating the shifted output to yield a third sub-message to the first data decoder engine and a fourth sub-message to the second decoder engine in the common circuit.

18. The method of claim 17, wherein the number of signal routes directly between the first data decoder engine and the second data decoder engine is less than twenty.

19. The method of claim 17, wherein the common circuit is operable to:

perform the syndrome calculation based at least in part on both the first sub-message and the second sub-message to yield a syndrome value.

20. A data processing system, the data processing system comprising:

a low density parity check data decoder circuit including at least a first data decoder circuit and a second data decoder circuit each electrically coupled to a common circuit, wherein the first data decoder circuit is operable to perform variable node updating for a first portion of a codeword, and the second data decoder circuit is operable to perform variable node updating for a second portion of the codeword, wherein the common circuit is operable to perform an error determination on a combination of at least the first portion and the second portion of the codeword, and wherein the first data decoder circuit and the second data decoder circuit are physically layed out in relation to the common circuit such that at least one side of the common circuit is physically accessible by routes from another circuit.

21. The data processing system of claim 20, wherein the data processing system is implemented as part of a data storage device, and wherein the data storage device comprises:

a storage medium operable to store information corresponding to a codeword;

a head assembly disposed in relation to the storage medium and operable to provide a sensed signal corresponding to the information;

a read channel circuit including:

an analog front end circuit operable to provide an analog signal corresponding to the sensed signal;

an analog to digital converter circuit operable to sample the analog signal to yield a series of digital samples; and an equalizer circuit operable to equalize the digital samples corresponding to the data set to yield the codeword, wherein the codeword includes the first portion of the codeword and the second portion of the codeword.

22. A data processing system, the data processing system comprising:

a data decoder circuit including at least:

a first means for performing variable node updating for a first portion of a codeword, and generating a first sub-message corresponding to the first portion;

a second means for performing variable node updating for a second portion of a codeword, and generating a second sub-message corresponding to the second portion; and a common means for shifting a combination of both the first sub-message and the second sub-message to yield a shifted output, and disaggregating the shifted output to yield a third sub-message to the first data decoder engine and a fourth sub-message to the second decoder engine.

* * * * *